United States Patent
Zeng et al.

(10) Patent No.: US 10,029,438 B2
(45) Date of Patent: *Jul. 24, 2018

(54) THERMOSETTING RESIN COMPOSITION AND USE THEREOF

(71) Applicant: Shengyi Technology Co., Ltd., Guangdong (CN)

(72) Inventors: Xianping Zeng, Guangdong (CN); Nana Ren, Guangdong (CN)

(73) Assignee: SHENGYI TECHNOLOGY CO., LTD. (CN)

( * ) Notice: Subject to any disclaimer, the term of this patent is extended or adjusted under 35 U.S.C. 154(b) by 216 days.

This patent is subject to a terminal disclaimer.

(21) Appl. No.: 14/580,284

(22) Filed: Dec. 23, 2014

(65) Prior Publication Data
US 2015/0189747 A1     Jul. 2, 2015

(30) Foreign Application Priority Data
Dec. 27, 2013 (CN) .......................... 2013 1 0740743

(51) Int. Cl.
| | |
|---|---|
| *B32B 5/02* | (2006.01) |
| *C08L 79/04* | (2006.01) |
| *H05K 1/03* | (2006.01) |
| *C08J 5/24* | (2006.01) |
| *B32B 5/26* | (2006.01) |
| *B32B 15/14* | (2006.01) |
| *C08K 5/00* | (2006.01) |
| *C08L 63/00* | (2006.01) |
| *C08L 85/02* | (2006.01) |
| *C08G 73/06* | (2006.01) |

(52) U.S. Cl.
CPC .............. *B32B 5/024* (2013.01); *B32B 5/022* (2013.01); *B32B 5/26* (2013.01); *B32B 15/14* (2013.01); *C08J 5/24* (2013.01); *C08K 5/0033* (2013.01); *C08L 63/00* (2013.01); *C08L 79/04* (2013.01); *C08L 85/02* (2013.01); *H05K 1/0353* (2013.01); *B32B 2260/021* (2013.01); *B32B 2260/046* (2013.01); *B32B 2262/101* (2013.01); *B32B 2264/10* (2013.01); *B32B 2307/306* (2013.01); *B32B 2307/3065* (2013.01); *B32B 2307/7265* (2013.01); *B32B 2457/08* (2013.01); *C08G 73/0655* (2013.01); *C08J 2379/00* (2013.01); *C08J 2485/02* (2013.01); *H05K 1/0366* (2013.01); *H05K 2201/012* (2013.01); *Y10T 428/31507* (2015.04); *Y10T 428/31529* (2015.04); *Y10T 428/31605* (2015.04)

(58) Field of Classification Search
CPC ........ C08L 85/02; C08L 63/00; H05K 1/0373
USPC ........................................................ 428/418
See application file for complete search history.

(56) References Cited

U.S. PATENT DOCUMENTS

| | | | | |
|---|---|---|---|---|
| 2011/0139496 A1* | 6/2011 | Nakamura | ................ | B32B 7/12 174/256 |
| 2011/0223383 A1* | 9/2011 | Goto | ................... | C08G 59/621 428/141 |
| 2012/0121843 A1* | 5/2012 | Lebel | .................. | A47G 9/0207 428/36.92 |

FOREIGN PATENT DOCUMENTS

| | | | |
|---|---|---|---|
| CN | 102020830 | | 4/2011 |
| CN | 102850722 | | 1/2013 |
| CN | 103328702 | | 9/2013 |
| JP | 2009-20919 | * | 2/2009 |
| JP | 2009-263550 | * | 11/2009 |

OTHER PUBLICATIONS

Machine translation of JP 2009-263550 (no date).*
Machine translation of JP 2009-040919 (no date).*
Nippon Kayaku, Epoxy resins Reactive flame retardants hardeners, 13th edition (no date).*

* cited by examiner

*Primary Examiner* — Doris L Lee
(74) *Attorney, Agent, or Firm* — McDonald Hopkins LLP

(57) ABSTRACT

The present invention relates to a thermosetting resin composition, which comprises: (A) cyanate ester compound and/or cyanate ester prepolymer; and (B) polyphosphonate ester and/or phosphonate-carbonate copolymer. The thermosetting resin composition provided by the present invention has low dielectric constant and dielectric loss tangent. The prepreg and copper clad laminate made from the above-mentioned thermosetting resin composition have excellent dielectric properties and wet-heat resistance, UL94 V-0 flame resistance, and good processability.

7 Claims, No Drawings

THERMOSETTING RESIN COMPOSITION AND USE THEREOF

TECHNICAL FIELD

The present invention relates to a thermosetting resin composition, particularly to a halogen-free thermosetting resin composition, and prepreg, laminate and high-frequency circuit board made from them.

BACKGROUND ART

As the information processing of electronic products becomes more and more high-speed and multifunctional, the amount of transmitted information continuously increases, the application frequency is required increase constantly, and moreover, the communication devices are continuously miniaturized, thereby the requirement for the electronic devices which are more miniaturized, lightweight and capable of high-speed information transmission becomes more and more urgent. At present, the operating frequency of the conventional communication device is generally more than 500 MHz, 1~10 GHz for most of them; with the demand on transmission of large information in a short time, the operating frequency also increases continuously. But signal integrity problems arise with the increasing frequency. As a basic material of signal transmission, the dielectric property of the copper clad laminates is one of the major factors influencing the signal integrity. In general, the smaller the dielectric constant of the substrate material is, the faster the transmission rate will be, the smaller the dielectric loss tangent value will be, and the better the signal integrity will be. For substrates, how to reduce the dielectric constant and dielectric loss tangent becomes a hot issue in technical research in recent years.

In addition, in order to meet the requirements for PCB processing performance and terminal electronic products performance, the copper-clad substrate material must has good dielectric properties, heat resistance and mechanical properties, and also has good processing characteristics, high peel strength, low water absorption, excellent wet-heat resistance and UL94 V-0 flame resistance levels.

As we all known, there are a variety of materials with small dielectric constant and dielectric loss tangent characteristic, such as polyolefins, fluorine resins, polystyrene, polyphenylene ether, modified polyphenylene ether, bismaleimide-triazine resin and polyvinyl benzene resins. Although the resins above have good dielectric properties, they all have defects, such as processing difficulty and poor heat resistance, and therefore unable to meet the requirements of the copper-clad substrate.

CN102597089A discloses a resin composition comprising cyanate ester polymer and condensed phosphate ester, a cured resin, a sheet-like cured resin, a laminate body, a prepreg, electronic parts, single and multilayer circuit boards, which is used in and particularly suitable for single and multilayer circuit boards with high-frequency range above 100 MHz. However, the condensed phosphate ester employed has small molecular weight and large plasticity, which have a great impact on the heat resistance of the curing system, thus it cannot meet the requirements of high heat resistance.

SUMMARY OF THE INVENTION

One object of the present invention is to provide a thermosetting resin composition, which can provide excellent dielectric properties, wet-heat resistance and mechanical properties which is required for the copper clad laminate. Meanwhile, it also have good processing characteristics, high peel strength, low water absorption, high Tg, excellent wet-heat resistance performance and UL 94 V-0 level of halogen-free flame resistance.

To achieve the object above, the present invention employs the following solution:

A thermosetting resin composition, wherein the resin composition comprises:

(A) a cyanate ester compound and/or cyanate ester prepolymer;

(B) polyphosphonate ester and/or phosphonate-carbonate copolymer.

The present invention adopted polyphosphonate ester and/or phosphonate-carbonate copolymer as flame retardant, having the advantages of high molecular weight, excellent heat resistance and low plasticity.

Preferably, the polyphosphonate ester has the following structural formula:

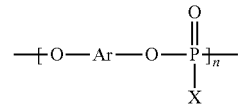

wherein, Ar is aryl group, —O—Ar—O— comprises but is not limited to one selected from the group consisting of resorcinol active group, hydroquinone active group, bisphenol A active group, bisphenol F active group, 4,4'-bisphenol active group, phenolphthalein, 4,4'-thiodiphenol active group, 4,4'-sulfonyl diphenol active group and 3,3,5-trimethylcyclohexyl diphenol active group; X is selected from the group consisting of substituted or unsubstituted straight chain alkyl of C1-C20, substituted or unsubstituted branched alkyl of C1-C20, substituted or unsubstituted straight-chain alkenyl of C2-C20, substituted or unsubstituted branched alkenyl of C2-C20, substituted or unsubstituted straight-chain Alkylene of C2-C20, substituted or unsubstituted branched Alkylene of C2-C20, substituted or unsubstituted cycloalkyl of C5-C20 and substituted or unsubstituted aryl of C6-C20; n is any integer between 1 and 75, such as 2, 5, 8, 10, 15, 20, 25, 30, 35, 40, 45, 50, 55, 60, 65, 70 or 72.

Preferably, the structural formula of the phosphonate-carbonate copolymer is as follows:

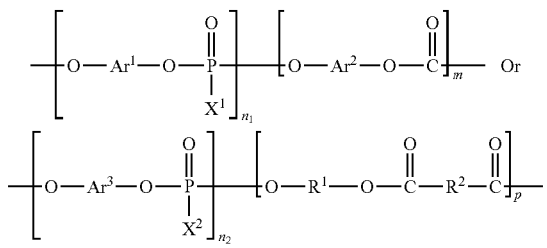

wherein, $Ar^1$, $Ar^2$ and $Ar^3$ are each independently aryl group; The —O—$Ar^3$—O— comprises but is not limited to any one selected from the group consisting of resorcinol active group, hydroquinone active group, bisphenol A type active group, bisphenol F type active group, 4,4'-bisphenol active group, phenolphthalein, 4,4'-thiodiphenol active group, 4,4'-sulfonyl diphenol active group and 3,3,5-trimethylcyclohexyl diphenol active group; $X^1$ and $X^2$ are each independently selected from the group consisting of substituted or unsubstituted straight chain alkyl of C1-C20, substituted or unsubstituted branched alkyl of C1-C20, substituted or unsubstituted straight-chain alkenyl of C2-C20, substituted or unsubstituted branched alkenyl of C2-C20, substituted or unsubstituted straight-chain alkylene of C2-C20, substituted or unsubstituted branched alkylene of C2-C20, substituted or unsubstituted cycloalkyl of C5-C20 and substituted or unsubstituted aryl of C6-C20; M is any integer between 1 and 100; $n_1$ and $n_2$ are each independently any integer between 1 and 75; p is any integer between 2 and 50; $R^1$, $R^2$ are each independently selected from substituted or unsubstituted aliphatic or aromatic hydrocarbon groups, preferably unsubstituted aliphatic or aromatic hydrocarbon groups.

"Aryl" refers to any functional group or substituent derived from an aromatic ring. Illustrative examples of aromatic ring include methylbenzene, Ethylbenzene, n-propylbenzene, isopropylbenzene, styrene, phenol, acetophenone, anisole, ethoxybenzene, benzyl alcohol, benzaldehyde, benzoyl chloride, benzoic acid, cyanobenzene, nitrobenzene, nitrosyl benzene, aniline, fluorobenzene, chlorobenzene, bromobenzene, iodobenzene, benzenesulfonic acid, diphenyl ketone, benzil, phenylacetic acid, mandelic acid, cinnamic acid, acetanilide, phenethylamine, azobenzene, benzene diazonium chloride, benzoyl peroxide, benzyl chloride, benzenesulfonyl chloride, diphenylmethane, triphenylmethane, trityl alcohol, trityl chloride, tetraphenyl methane, xylene (o-toluene, m-xylene, p-xylene), dihydroxybenzene (o-dihydroxybenzene, resorcinol, hydroquinone), phthalic acid (phthalic acid, m phthalic acid, terephthalic acid), phenylenediamine (o-phenylenediamine, m-phenylenediamine, p-phenylenediamine), toluidine (o-toluidine, m-toluidine, p-toluidine), benzene-m-disulfonic acid, toluene-p-sulfonic acid, p-aminobenzoic acid, salicylic acid, acetylsalicylic acid, acetaminophen, phenacetin, m-chloroperoxybenzoic acid, mesitylene, unsym-trimethyl benzene, durene, gallic acid, pyrogallol, picric acid, trinitrotoluene, tribromo phenol, pentachlorophenol, mellitic acid, biphenyl, terphenyl, naphthalene, anthracene, phenanthrene, benzoquinone (o-benzoquinone, p-benzoquinone), and the aryl can be any functional group or substituent derived from the anaromatic ring mentioned above.

Preferably, the polyphosphonate ester and/or phosphonate-carbonate copolymer comprises but is not limited to one or a mixture of at least two selected from the group consisting of:

wherein, R3 and R4 are independently selected from substituted or unsubstituted aliphatic or aromatic hydrocarbon group, preferably unsubstituted aliphatic or aromatic hydrocarbon group; $m_1$ is any integer between 1 and 100; $n_3$, $n_4$ and $n_5$ are each independently any integer between 1 and 75; $p_1$ is any integer between 2 and 50; preferably, m and m1 are each independently any integer between 5 and 100; preferably, m and m1 are each independently any integer between 10 and 100; preferably, $n_1$, $n_2$, $n_3$, $n_4$ and $n_5$ are each independently any integer between 5 and 75; preferably, $n_1$, $n_2$, $n_3$, $n_4$ and $n_5$ are each independently any integer between 10 and 75.

Preferably, $p_1$ and $p_2$ are each independently any integer between 5 and 50; preferably $p_1$ and $p_2$ are each independently any integer between 10 and 50; m and $m_1$ are each independently such as 2, 5, 10, 15, 20, 25, 30, 35, 40, 45, 50, 55, 60, 65, 70, 75, 80, 85, 90 or 95; $n_1$, $n_2$, $n_3$, $n_4$ or $n_5$ are each independently such as 2, 5, 8, 10, 15, 20, 25, 30, 35, 40, 45, 50, 55, 60, 65, 70 or 72; $p_1$ or $p_2$ are each independently such as 3, 5, 10, 14, 18, 22, 26, 30, 34, 38, 42, 45 or 48.

Preferably, the weight-average molecular weight of the polyphosphonate ester and/or phosphonate-carbonate copolymer is independently 1000-60000, preferably 2000-50000 and more preferably 2500-10000. When the weight-average molecular weight is below 1000, after addition to the cured resin, the heat resistance of the cured product will be reduced, for example, the glass transition temperature will decrease; however when the weight-average molecular weight is more than 60000, the polyphosphonate ester and/or phosphonate-carbonate copolymer has very poor solubility in organic solvent, thus good and uniform resin glue can't be obtained and the technical requirements of copper clad laminate can not be met.

The cyanate ester refers to the resin which contains two or more than two cyanate group (—OCN) in its molecular structure.

Preferably, the cyanate ester compound of the present invention has the following structural formula:

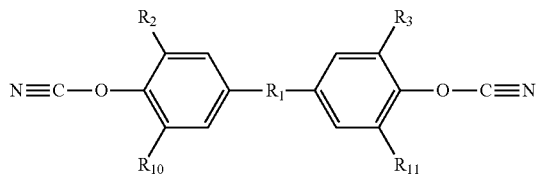

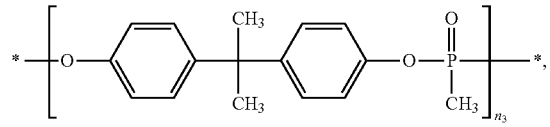

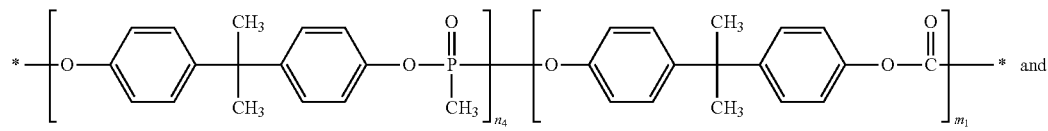

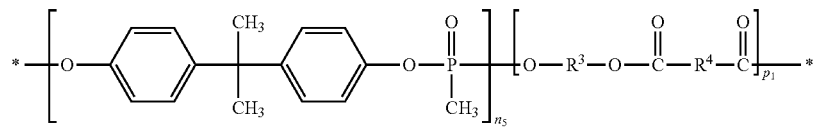

wherein,
R1 is selected from

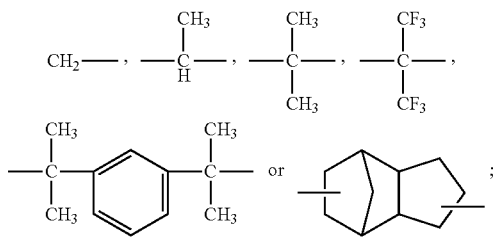

R$_2$, R$_3$, R$_{10}$ and R$_{11}$ are each independently any one selected from the group consisting of hydrogen atom, substituted or unsubstituted C1-C4 straight chain alkyl and substituted or unsubstituted C1-C4 branched alkyl; R$_2$, R$_3$, R$_{10}$ and R$_{11}$ can be the same or not the same;

Preferably, the cyanate ester prepolymer of the present invention has the following structural formula:

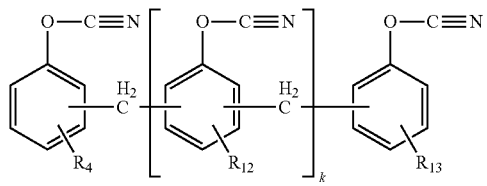

wherein,
R$_4$, R$_{12}$ and R$_{13}$ are each independently any one selected from the group consisting of hydrogen atom, substituted or unsubstituted C1-C4 straight chain alkyl and substituted or unsubstituted C1-C4 branched alkyl; k is any integer between 1 and 7. Preferably, the component (A) is one or a mixture selected from 2,2-bis(4-cyanatophenyl) propane, bis(4-cyanatophenyl)ethane, bis(3,5-dimethyl-4-cyanatophenyl)methane, 2,2-bis(4-cyanatophenyl)-1,1,1,3,3,3-hexafluoropropane, α,α'-bis(4-cyanatophenyl)-m-diisopropylbenzene, cyclopentadiene-type cyanate, Phenol Novolac Cyanate Ester, Cresol novolac cyanate ester, 2,2-bis(4-cyanatophenyl)propane prepolymer, bis (4-cyanatophenyl)ethane prepolymer, bis (3,5-dimethy-4-cyanatophenyl)methane prepolymer, 2,2-bis(4-cyanatophenyl)-1,1,1,3,3,3-hexafluoropropane prepolymer, α,α'-bis(4-cyanatophenyl)-m-diisopropylbenzene prepolymer, cyclopentadiene-type cyanate ester prepolymer, phenol novolac cyanate ester prepolymer and cresol novolac cyanate ester prepolymer; illustrative acyanate ester compound and/or cyanate ester prepolymer is such as the mixture of 2-bis-(4-cyanatophenyl)propane and bis-(4-cyanatophenyl)ethane, the mixture of bis-(3,5-dimethyl-4-cyanatophenyl) methane and 2,2-bis(4-cyanatophenyl)-1,1,1,3,3,3-hexafluoropropane, the mixture of α,α'-bis(4-cyanatophenyl)-m-diisopropylbenzene and cyclopentadiene-type cyanate, the mixture of phenol novolac cyanate ester and cresol novolac cyanate ester, the mixture of 2,2-bis(4-cyanatophenyl)propane prepolymer, bis(4-cyanatophenyl)ethane prepolymer and bis(3,5-dimethyl-4-cyanatophenyl)methane prepolymer, the mixture of 2,2-bis(4-cyanatophenyl)-1,1,1,3,3,3-hexafluoropropane prepolymer, α,α'-bis(4-cyanatophenyl)-m-diisopropylbenzene prepolymer, and the mixture of cyclopentadiene-type cyanate ester prepolymer, phenol novolac cyanate ester prepolymer and cresol novolac cyanate ester prepolymer. Preferably any one or a mixture of at least two selected from a group of bis(4-cyanato phenyl) propane, α,α'-bis(4-cyanatophenyl)-m-diisopropylbenzene, bis(3,5-dimethyl-4-cyanatophenyl)methane, 2,2-bis(4-cyanatophenyl)propane prepolymer, α,α'-bis(4-cyanatophenyl)-m-diisopropylbenzene prepolymer or bis(3,5-dimethyl-4-cyanato phenyl) methane prepolymer.

A thermosetting resin composition, wherein the resin composition comprises: (A) a cyanate ester compound and/or cyanate ester prepolymer: 50-90 parts by weight; (B) polyphosphonate ester and/or phosphonate-carbonates copolymer: 10~50 parts by weight; preferably, the resin composition comprises (A) cyanate ester compound and/or cyanate ester prepolymer: 60-80 parts by weight; (B) polyphosphonate ester and/or phosphonate-carbonates copolymer: 20-40 parts by weight; more preferably, the resin composition comprises (A) cyanate ester compound and/or cyanate ester prepolymer: 70-80 parts by weight; (B) polyphosphonate ester and/or phosphonate-carbonate copolymer: 20-30 parts by weight. The parts by weight of (A) cyanate ester compound and/or cyanate ester prepolymer is such as 52 parts by weight, 54 parts by weight, 57 parts by weight, 61 parts by weight, 65 parts by weight, 68 parts by weight, 72 parts by weight, 76 parts by weight, 78 parts by weight, 82 parts by weight, 86 parts by weight, 88 parts by weight; the parts by weight the (B) polyphosphonate ester and/or phosphonate-carbonates copolymer is such as 12 parts by weight, 15 parts by weight, 18 parts by weight, 24 parts by weight, 27 parts by weight, 32 parts by weight, 38 parts by weight, 42 parts by weight, 46 parts by weight, 48 parts by weight.

Those skilled in the art can obtain the thermosetting resin composition of the present invention by selecting suitable components such as cured agents and promotors, to coordinate with components (A) and (B) according to the formulation of the thermosetting resin composition disclosed in the prior art.

If necessary, the thermosetting resin composition of the present invention further comprises (C) halogen-free epoxy resin. Preferably, the halogen-free epoxy resin is any one or a mixture of at least two selected from the group consisting of halogen free bisphenol A type epoxy resin, bisphenol F type epoxy resin, cresol novolac epoxy resin, bisphenol A novolac type epoxy resin, triphenol type novolac epoxy resin, nitrogen-containing epoxy resin, silicon-containing epoxy resin, dicyclopentadiene type epoxy resin, biphenyl type novolac epoxy resin, Alkylbenzene type novolac epoxy resin, and naphthol type novolac epoxy resin; the mixture is such as the mixture of Bisphenol A type epoxy resin and Bisphenol F type epoxy resin, the mixture of cresol novolac epoxy resin and bisphenol A novolac type epoxy resin, the mixture of triphenol type novolac epoxy resin and nitrogen-containing epoxy resin, the mixture of silicon-containing epoxy resin and dicyclopentadiene type epoxy resin, the mixture of biphenyl type novolac epoxy resin and alkylbenzene type novolac epoxy resin and the mixture of naphthol type novolac epoxy resin and bisphenol A type epoxy resin.

Preferably, the component (C) halogen-free epoxy resin is selected from the epoxy resin with the following structural formula:

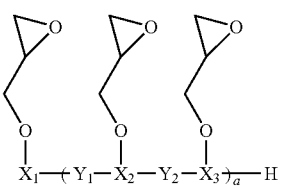

wherein,

X₁, X₂, and X₃ are each independently selected from

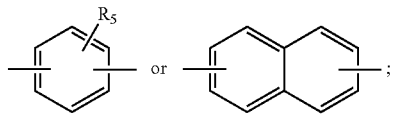

R₅ is selected from the group consisting of hydrogen atom, substituted or unsubstituted C1-C5 straight chain alkyl, substituted or unsubstituted C1-C5 branched alkyl; Y₁ and Y₂ are each independently any one selected from the group consisting of single bond,

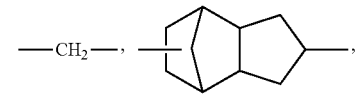

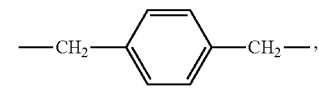

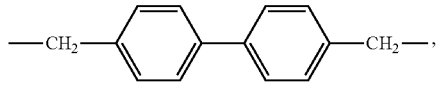

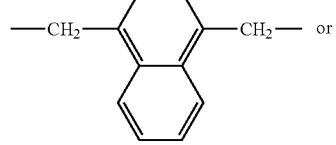

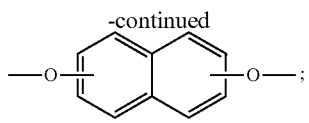

a is any integer between 1 and 10, and R₆ is one selected from the group consisting of hydrogen atom, substituted or unsubstituted C1-C5 straight chain alkyl, substituted or unsubstituted C1-C5 branched alkyl.

Preferably, the halogen-free epoxy resin is one or more selected from the group consisting of the epoxy resin having the following structural formula:

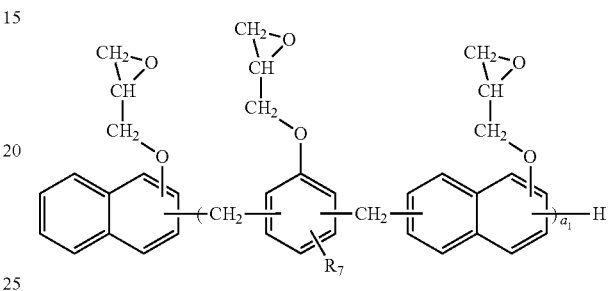

wherein, a₁ is any integer between 1 and 10, such as 2, 3, 4, 5, 6, 7, 8 or 9; R7 is selected from the group consisting of hydrogen atom, substituted or unsubstituted C1-C5 straight chain alkyl and substituted or unsubstituted C1-C5 branched alkyl;

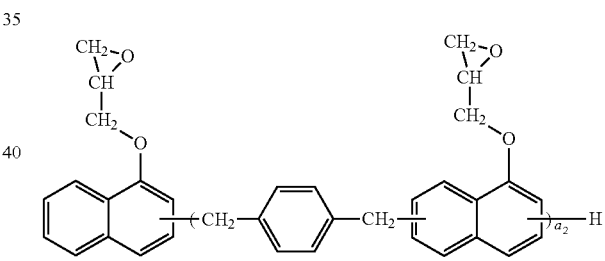

wherein, a₂ is any integer between 1 and 10, such as 2, 3, 4, 5, 6, 7, 8 or 9;

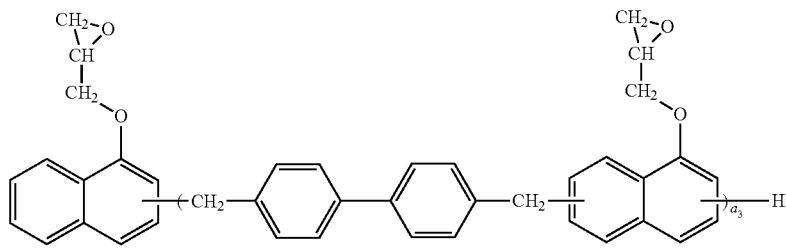

wherein, $a_3$ is any integer between 1 and 10, such as 2, 3, 4, 5, 6, 7, 8 or 9;
or

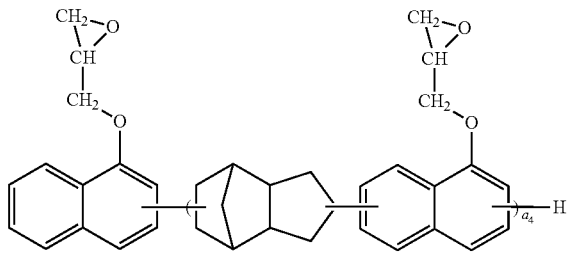

wherein, $a_4$ is any integer between 1 and 10, such as 2, 3, 4, 5, 6, 7, 8 or 9.

Preferably, the halogen-free epoxy resin is selected from the epoxy resin having the following structural formula:

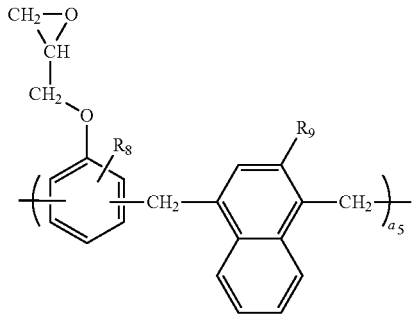

wherein, $a_5$ is any integer between 2 and 10, such as 3, 4, 5, 6, 7, 8 or 9; R8 and R9 are each independently one selected from the group consisting of hydrogen atom, substituted or unsubstituted C1-C5 straight chain alkyl, and substituted or unsubstituted C1-C5 branched alkyl.

Based on the calculation of the component (A) cyanate ester compound and/or cyanate ester prepolymer as 100 parts by weight, the addition amount of the component (C) halogen-free epoxy resin is 10-50 parts by weight, such as 12 parts by weight, 14 parts by weight, 18 parts by weight, 22 parts by weight, 24 parts by weight, 29 parts by weight, 32 parts by weight, 35 parts by weight, 38 parts by weight, 42 parts by weight, 46 parts by weight, 48 parts by weight; preferably, 20-40 parts by weight.

If necessary, the thermosetting resin composition of the present invention further comprises component (D) filler. There is no special limitation for the filler added according to need. The filler is selected from organic and/or inorganic filler, preferably the inorganic filler, more preferably the surface-treated inorganic filler, and most preferably, the surface-treated silicon dioxide.

The surface treatment agent for surface treatment is one or more selected from the group consisting of silane coupling agents, organosilicone oligomer, or titanate coupling agent. The silane coupling agent is one or more selected from the group consisting of vinyl tri-methoxysilane, vinyltriethoxysilane, 3-glycidoxy propyl trimethoxy silane, 2-(3,4-epoxy cyclohexyl) ethyltrimethoxy silane, 3-glycidoxy propyl triethoxysilane, 3-glycidoxy methyl dimethoxy silane, p-isobutylene trimethoxy silane, 3-propyl methacrylate triethoxy silane, 3-propyl methacrylate methyldimethoxy silane, 3-Isobutyl allyl methyl dioxolmethy silane, 3-allyl trimethoxy silane, N-2-(aminoethyl)-3-aminopropyl methyldimethoxy silane, N-2-(aminoethyl)-3-aminopropyl trimethoxy silane, N-2-(aminoethyl)-3-aminopropyl triethoxy silane, 3-aminopropyl triethoxy silane, 3-triethoxysilyl monosilane-N-(1,3-dimethyl-butylidene) propylamine, N-phenyl-3-aminopropyl trimethoxy silane or 3-isocyanate propyl triethoxy silane.

The usage amount of the silane coupling agents is not specified. In general, the addition amount is based on the calculation of inorganic filler as 100 parts by weight, and the usage amount of surface treatment agent is 0.5-5.0 parts by weight, preferably 0.5-3.0 weight parts by weight, more preferably 0.75-2.0 parts by weight.

The inorganic filler is any one or more selected from the group consisting of nonmetal oxide, metal nitride, non-metal nitride, inorganic hydrate, inorganic salt, metal hydrate or inorganic phosphorus; preferably any one or a mixture of at least two selected from the group consisting of crystalline silica, fused-silica, spherical silica, hollow silica, glass powder, aluminum nitride, boron nitride, silicon carbide, aluminum hydroxide, titanium oxide, strontium titanate, barium titanate, alumina, barium sulfate, talc powder, calcium silicate, calcium carbonate or mica.

The mixture is such as the mixture of crystalline silica and fused-silica, the mixture of spherical silica and hollow silica, the mixture of glass powder and aluminum nitride, the mixture of boron nitride and silicon carbide, the mixture of aluminum hydroxide and titanium oxide, the mixture of strontium titanate, barium titanate and alumina, the mixture of barium sulfate and talc powder, the mixture of calcium silicate, calcium carbonate and mica.

The organic filler is any one or a mixture of at least two selected from the group consisting of polytetrafluoroethylene powder, polyphenylene sulfide, Organophosphorus compounds or polyether sulfone powder. The mixture is such as the mixture of polytetrafluoroethylene powder and polyphenylene sulfide, and the mixture of organophosphorus compounds and polyether sulfone powder.

In addition, there is no special limitation for the shape and particle diameter of the filler. Preferably, the median particle diameter of the filler is 0.01-50 μm, such as 1 μm, 3 μm, 7 μm, 12 μm, 25 μm, 28 μm, 32 μm, 37 μm, 43 μm, 47 μm, 49 μm, preferably 0.01-20 μm, and more preferably 0.1-10 μm. The inorganic filler with the particle size within this range is more easily dispersed in the resin liquid.

Furthermore, there is no special limitation for the addition amount of component (D) filler. Based on the calculation of total weight of the component (A), component (B) and component (C) as 100 parts by weight, the addition amount of the component (D) filler is 5-1000 parts by weight such as 10 parts by weight, 80 parts by weight, 120 parts by weight, 230 parts by weight, 350 parts by weight, 450 parts by weight, 520 parts by weight, 680 parts by weight, 740 parts by weight, 860 parts by weight, 970 parts by weight; preferably, 5-200 parts by weight, and more preferably 15-150 parts by weight.

If necessary, the thermosetting resin composition of the present invention further comprises component (E) catalyst. There is no special limitation for the catalyst but catalyzing the curing the reaction of cyanate ester, cyanate ester and epoxy resin. The catalyst is selected from organic metal compounds, such as one or more selected from the group consisting of organic metal compounds, such as copper, zinc, cobalt, nickel, iron, imidazole compounds and their derivatives or tertiary amine; the illustrative component (E) catalyst is one or more selected from the group consisting of 2-methylimidazoline, 2-phenylimidazole, 2-ethyl-4-methylimidazole, tributylamine, triphenyl phosphine, boron trifluoride complex, octanoic acid metal salt, acetylacetone metal salt, metal naphthenate, salicylic acid metal salt and metallic stearates; the mixture are such as the mixture of metallic stearates and salicylic acid metal salt, the mixture of metal naphthenate and acetylacetone metal salt, the mixture of octanoic acid metal salt and boron trifluoride complex, the mixture of triphenyl phosphine and tributylamine, the mixture of 2-ethyl-4-methylimidazole and 2-phenylimidazole, the mixture of octanoic acid metal salt and tributylamine, the mixture of 2-ethyl-4-methylimidazole, the mixture of tributylamine and 2-phenylimidazole, wherein the metal is one or more selected from the group consisting of zinc, copper, iron, tin, cobalt and aluminum.

The addition amount of component (E) catalyst is based on the calculation of total weight of the component (A), component (B) and component (C) as 100 parts by weight, and the addition amount of the filler is 0.01-1.0 parts by weight. The addition amount is such as 0.02 parts by weight, 0.1 parts by weight, 0.2 parts by weight; 0.3 parts by weight 0.4 parts by weight 0.5 parts by weight 0.6 parts by weight 0.7 parts by weight 0.8 parts by weight, 0.9 parts by weight.

A thermosetting resin composition, wherein the resin composition comprises:

(A) a cyanate ester compound and/or cyanate ester prepolymer: 50-90 parts by weight;

(B) polyphosphonate ester and/or phosphonate-carbonate copolymer: 10-50 parts by weight.

A thermosetting resin composition, wherein the resin composition comprises:

(A) cyanate ester compound and/or cyanate ester prepolymer: 50-90 parts by weight;

(B) polyphosphonate ester and/or phosphonate-carbonate copolymer: 10-50 mparts by weight;

(C) halogen-free epoxy resin: based on the calculation of component (A) as 100 parts by weight, the addition amount of the halogen-free epoxy resin is 10-50 parts by weight.

A thermosetting resin composition, wherein the resin composition comprises:

(A) cyanate ester compound and/or cyanate ester prepolymer: 50-90 parts by weight;

(B) polyphosphonate ester and/or phosphonate-carbonate copolymer: 10-50 parts by weight;

(C) halogen-free epoxy resin: based on the calculation of component (A) as 100 parts by weight, the addition amount of the halogen-free epoxy resin is 10-50 parts by weight;

(D) filler: based on the calculation of total weight of the component (A), component (B) and component (C) as 100 parts by weight, the addition amount of the filler is 5~1000 parts by weight;

(E) catalyst: based on the calculation of total weight of component (A), component (B) and component (C) as 100 parts by weight, the addition amount of the filler is 0.01-1.0 parts by weight.

As used herein, the term "comprise" in the present invention means "to also include the other components besides the components mentioned already. Those "other components" give different characteristics to the resin composition. In addition, the term "comprises" in the present invention also can be replaced by closed type "is" or "consisting of".

For example, the thermosetting resin composition of the present invention can be added with cooperative thermosetting resin, specific examples of which include polyphenylene ether resin, phenolic resin, polyurethane resin, melamine resin. Curing agent or cured agent promotor of the thermosetting resin composition can also be added.

In addition, the thermosetting resin composition can also comprise various additives, specific examples of which include antioxidant, heat stabilizer, antistatic agent, ultraviolet absorbent, pigments, colorants, lubricant. The thermosetting resin and various additives can be used alone, also can be used in mixture of two or more.

The preparation methods of the resin composition of the present invention can be achieved according to the method disclosed in the prior art by formulating, stirring and mixing component (A), component (B), component (C), catalyst, filler, various thermosetting resin and various additives.

The resin glue can be obtained by dissolving or dispersing the thermosetting resin composition mentioned above in the solvent.

There is no special limitation for the solvent of the present invention, specific examples of which include alcohol solvent(methanol, ethanol, butanol etc.), ether solvent (ethyl cellosolve, butyl cellosolve, glycol monomethyl ether, carbitol, Butyl carbitol etc.), ketone solvent(acetone, butanone, methyl ethyl ketone, methyl isobutyl ketone, cyclohexanone etc.), aromatic hydrocarbon solvent(toluene, xylene, sym-trimethylbenzene etc.), ester solvent (ethoxy ethyl acetate, ethyl acetate etc.), nitrogen containing solvent (N, N-dimethyl formamide, N, N-dimethyl acetamide, N-methyl-2-pyrrolidone etc.). The solvents mentioned above can be used alone or be used in mixture of two or more, preferably, the mixture of aromatic hydrocarbon solvent, such as toluene, xylene, 1,3,5-trimethylbenzene etc., and ketone solvent such as acetone, butanone, methyl ethyl ketone, methyl isobutyl ketone, cyclohexanone etc. The usage amount of the solvent can be chosen by those skilled in the art according to their own experiences, to obtain the viscosity of the resin glue suitable for use.

Emulsifier can be added during the dissolving process or dispersing process of the resin composition mentioned above. The powder filler can be dispersed uniformly in glue solution by dispersion of emulsifier.

The second object of the present invention is to provide a prepreg, which comprises the enhancement material and the thermosetting resin composition mentioned above adhering to the enhancement material after impregnation and drying. There is no special limitation for the enhancement material, which can be organic fiber, inorganic fiber woven cloth or non-woven fabrics, wherein the organic fiber is preferably aramid nonwoven, the inorganic fiber woven cloth is preferably E-glass fiber, D-glass fiber, S-glass fiber, T-glass fiber, NE-glass fiber and quartz cloth. There is no special limitation for the thickness of the enhancement material; in respect of laminate's application and good dimensional stability, the thickness of the woven cloth or non-woven fabric optimization is preferably 0.01-0.2 mm, and preferably processed through open fiber processing and surface treatment with silane coupling agent. In order to provide good water resistance and heat resistance, the silane coupling agent is preferably any one or a mixture of at least two selected from a group consisting of epoxy silane coupling agent, amino silane coupling agent or any vinyl silane coupling agent. The prepreg is obtained by impregnating the prepreg made from the thermosetting resin composition, baking at 100-200° C. for 2-10 minutes and drying.

The third object of the present invention is to provide a laminate, which comprises at least one prepreg mentioned above. One or a few pieces of prepreg mentioned above are stacked together in certain order, and cured in a hot press machine to prepare the laminate. The curing temperature is 150-250° C. and the curing pressure is 25-60 $kg/cm^2$.

One or a few pieces of prepreg mentioned above are stacked together in certain order with copper foils are cladded on one or both sides of the stack; and they are cured in a hot press machine to prepare the copper-clad laminate. The curing temperature is 150-250° C. and the curing pressure is 25-60 kg/cm². The prepreg, the laminate and the copper-clad laminate of the present invention have excellent dielectric properties and wet-heat resistance, and they also have high glass transition temperature, low water absorption rate, and meanwhile achieve the halogen-free flame resistance of UL 94 V-0 level.

The fourth object of the present invention is to provide a high-frequency circuit board, which comprises at least one prepreg mentioned above and the copper foil cladded on both sides of the stacked prepregs.

Compared with prior art, the present invention has the following beneficial effects: ① The thermosetting resin provided by the present invention has a small dielectric constant and dielectric loss tangent; ② the present invention further adopts the polyphosphonate ester and/or phosphonate-carbonates copolymer as flame retardant, thereby halogen-free flame resistance is achieved and the flame resistance of the cured products reach UL 94 V-0 level, without sacrificing the heat resistance, low water absorption and excellent dielectric property of the original cured product; ③ the prepreg and the copper-clad laminate of the present invention prepared with the thermosetting resin composition mentioned above has excellent dielectric properties, wet-heat resistance, flame resistance of UL 94 V-0 level and good processing characteristics.

DETAILED DESCRIPTION

To better illustrate the present invention and understand technical solution of the present invention, the typical but non-limiting embodiments of the present invention are as follows:

Addressing the prepared copper clad laminate mentioned above, dielectric constant, dielectric loss factor, glass transition temperature and wet-heat resistance are all measured, and further described referring to the following embodiments.

Embodiment 1

A container is taken, added with bisphenol A type cyanate ester resin BA230S (LONZA Company, Cyano equivalent is 139 g/eq) of 80 parts by weight, then added with phosphonate-carbonate copolymer FRX CO 95 (FRX Polymers Company, phosphorous content is 10.8%) of 20 parts by weight and stirred uniformly. Then it is added with catalyst Zinc caprylate of 0.08 parts by weight and solvent butanone and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

Embodiment 2

A container is taken, added with bisphenol A type cyanate ester resin BA230S (LONZA Company, Cyano equivalent is 139 g/eq) of 55 parts by weight, then added with phosphonate-carbonates copolymer FRX CO 95 (FRX Polymers Company, phosphorous content is 10.6%) of 45 parts by weight and stirred uniformly. Then it is added with catalyst Zinc caprylate of 0.035 parts by weight and solvent butanone and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

Embodiment 3

A container is taken, added with novolac type cyanate ester resin PT-30 (LONZA Company, Cyano equivalent is 139 g/eq) of 90 parts by weight, then added with polyphosphonate ester HM1100 (FRX Polymers Company, Phosphorus content is 10.8%) of 10 parts by weight and stirred uniformly. Then it is added with catalyst Zinc caprylate of 0.035 parts by weight and solvent butanone and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

Embodiment 4

A container is taken, added with novolac type cyanate ester resin PT-30 (LONZA Company) of 55 parts by weight and dicyclopentadiene type novolac epoxy resin HP-7200H (Japan DIC Company, EEW is 278 g/eq) of 30 parts by weight, then added with phosphonate-carbonates copolymer FRX CO3000 (FRX Polymers Company, Phosphorus content is 10.6%) of 15 parts by weight and stirred uniformly. Then it is added with catalyst Zinc caprylate of 0.035 parts by weight and solvent butanone and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

Embodiment 5

A container is taken, added with novolac type cyanate ester resin PT-30 (LONZA Company) of 55 parts by weight and alkylbenzene type novolac epoxy resin NC-2000L (Nippon Kayaku Co., Ltd., EEW is 238 g/eq) of 30 parts by weight, then added with polyphosphonate ester FRX OL5000 (FRX Polymers Company, Phosphorus content is 10.8%) of 15 parts by weight and stirred uniformly. Then it is added with catalyst Zinc caprylate of 0.035 parts by weight and solvent butanone and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

Embodiment 6

A container is taken, added with novolac type cyanate ester resin PT-30 (LONZA Company) of 60 parts by weight and naphthol type novolac epoxy resin NC-7000L (Nippon Kayaku Co., Ltd., EEW is 232 g/eq) of 30 parts by weight, then added with phosphonate-carbonates copolymer FRX CO6000 (FRX Polymers Company, Phosphorus content is 10.6%) of 10 parts by weight and stirred uniformly. Then it is added with catalyst Zinc caprylate of 0.035 parts by weight and solvent butanone and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

Embodiment 7

A container is taken, added with bisphenol A type cyanate ester resin BA230S (LONZA Company, Cyano equivalent is 139 g/eq) of 60 parts by weight and bisphenol type novolac epoxy resin N690 (Japan DIC Company, EEW is 205 g/eq) of 15 parts by weight, then added with phosphonate-carbonates copolymer FRX CO6000 (FRX Polymers Company, Phosphorus content is 10.6%) of 25 parts by weight and stirred uniformly. Then it is added with catalyst Zinc caprylate of 0.035 parts by weight and solvent butanone and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

Embodiment 8

A container is taken, added with novolac type cyanate ester resin PT-30 (LONZA Company) of 60 parts by weight, bisphenol novolac type epoxy resin N690 (Japan DIC Company, EEW is 205 g/eq) of 15 parts by weight, then added with phosphonate-carbonate copolymer FRX CO6000 (FRX Polymers Company, Phosphorus content is 10.6%) of 25 parts by weight and stirred uniformly. Then it is added with catalyst Zinc caprylate of 0.035 parts by weight and solvent butanone and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

Embodiment 9

A container is taken, added with bisphenol A type cyanate ester resin BA230S (LONZA Company, Cyano equivalent is 139 g/eq) of 60 parts by weight and bisphenol novolac type epoxy resin N690 (Japan DIC Company, EEW is 205 g/eq) of 15 parts by weight, then added with polyphosphonate ester FRX 100 (FRX Polymers Company, Phosphorus content is 10.8%) of 30 parts by weight and stirred uniformly. Then it is added with catalyst Zinc caprylate of 0.035 parts by weight and solvent butanone and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

Embodiment 10

A container is taken, added with novolac type cyanate ester resin PT-30 (LONZA Company) of 60 parts by weight and dicyclopentadiene type epoxy resin HP-7200H (Japan DIC Company, EEW is 278 g/eq) of 6 parts by weight, then added with phosphonate-carbonate copolymer FRX CO6000 (FRX Polymers Company, Phosphorus content is 10.6%) of 40 parts by weight and stirred uniformly. Then it is added with catalyst Zinc caprylate of 0.035 parts by weight and solvent butanone and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

Embodiment 11

A container is taken, added with novolac type cyanate ester resin PT-30 (LONZA Company) of 70 parts by weight and dicyclopentadiene type epoxy resin HP-7200H (Japan DIC Company, EEW is 278 g/eq) of 35 parts by weight, then added with phosphonate-carbonate copolymer FRX CO6000 (FRX Polymers Company, Phosphorus content is 10.6%) of 30 parts by weight and stirred uniformly. Then it is added with catalyst Zinc caprylate of 0.035 parts by weight and solvent butanone and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

Embodiment 12

A container is taken, added with novolac type cyanate ester resin PT-30 (LONZA Company) of 60 parts by weight and alkylbenzene type novolac epoxy resin NC-2000L (Nippon Kayaku Co., Ltd., EEW is 238 g/eq) of 12 parts by weight, then added with phosphonate-carbonate copolymer FRX CO6000 (FRX Polymers Company, Phosphorus content is 10.6%) of 40 parts by weight and stirred uniformly. Then it is added with silicon dioxide of 15.6 parts by weight and solvent butanone, and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

Embodiment 13

A container is taken, added with novolac type cyanate ester resin PT-30 (LONZA Company) of 70 parts by weight and naphthol type novolac epoxy resin NC-7000L (Nippon Kayaku Co., Ltd., EEW is 232 g/eq) of 30 parts by weight, then added with phosphonate-carbonate copolymer FRX CO6000 (FRX Polymers Company, Phosphorus content is 10.6%) of 30 parts by weight and stirred uniformly. Then it is added with silicon dioxide subject to surface treatment with vinyl trimethoxy silane of 150 parts by weight and solvent butanone, and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

Embodiment 14

A container is taken, added with novolac type cyanate ester resin PT-30 (LONZA Company) of 70 parts by weight and biphenyl type novolac epoxy resin NC-3000H (Nippon Kayaku Co., Ltd., EEW is 288 g/eq) of 30 parts by weight, then added with phosphonate-carbonate copolymer FRX CO6000 (FRX Polymers Company, Phosphorus content is 10.6%) of 30 parts by weight and stirred uniformly. Then it is added with silicon dioxide SC2050 (Admatechs, D50: 0.5 μm) of 100 parts by weight and solvent butanone, and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

COMPARATIVE EXAMPLE 1

A container is taken, added with novolac type cyanate ester resin PT-30 (LONZA Company) of 60 parts by weight and bisphenol novolac type epoxy resin N690 (Japan DIC Company, EEW is 205 g/eq) of 15 parts by weight, then added with flame retardant phosphonate ester PX-200 (Daihachi Chemical Industry, Phosphorus content is 9%) of 25 parts by weight and stirred uniformly. Then it is added with catalyst Zinc caprylate of 0.035 parts by weight and solvent butanone, and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

COMPARATIVE EXAMPLE 2

A container is taken, added with bisphenol A type cyanate ester resin BA230S (LONZA Company, Cyano equivalent is 139 g/eq) of 60 parts by weight and bisphenol novolac type epoxy resin N690 (Japan DIC Company, EEW is 205 g/eq) of 15 parts by weight, then added with phosphazene flame retardant SP-100 (Otsuka Chemical, Phosphorus content is 13.4%) of 25 parts by weight and stirred uniformly. Then it is added with catalyst Zinc caprylate of 0.035 parts by weight and solvent butanone, and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

COMPARATIVE EXAMPLE 3

A container is taken, added with bisphenol A type cyanate ester resin BA230S (LONZA Company, Cyano equivalent is 139 g/eq) of 60 parts by weight and bisphenol novolac type epoxy resin N690 (Japan DIC Company, EEW is 205 g/eq) of 15 parts by weight, then added with flame retardant phosphate ester FP-600 (ADEKA, Phosphorus content is 8.9%) of 30 parts by weight and stirred uniformly. Then it is added with catalyst Zinc caprylate of 0.035 parts by weight and solvent butanone, and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

COMPARATIVE EXAMPLE 4

A container is taken, added with novolac type cyanate ester resin PT-30 (LONZA Company, Cyano equivalent is 139 g/eq) of 55 parts by weight and dicyclopentadiene type epoxy resin HP-7200H (Japan DIC Company, EEW is 278 g/eq) of 30 parts by weight, then stirred uniformly. Then it is added with catalyst Zinc caprylate of 0.035 parts by weight and solvent butanone, and stirred uniformly to obtain a glue solution. Glass fiber cloth (model number: 2116, thickness: 0.08 mm) is impregnated into the glue solution mentioned above, controlled to an appropriate thickness, and then dried to remove the solvent to obtain the prepreg. Several pieces of prepared prepregs are stacked, one piece of copper foils is cladded on both sides of the stacked prepregs, and they are cured in a hot press machine to obtain a copperclad laminate. The cured temperature is 150-250° C., cured press is 25-60 kg/cm² and cured time is 90-120 min.

TABLE 1

Physical Property Data of Each Embodiment and Comparative Example

| performance index | Embodiment 1 | Embodiment 2 | Embodiment 3 | Embodiment 4 | Embodiment 5 | Embodiment 6 |
|---|---|---|---|---|---|---|
| Tg(DMA)/° C. | 268 | 260 | 325 | 280 | 270 | 265 |
| Dk(5G) | 3.8 | 3.85 | 3.8 | 3.7 | 3.8 | 3.9 |
| Df(5G) | 0.0055 | 0.006 | 0.0065 | 0.006 | 0.0055 | 0.005 |
| Water Absorption, % | 0.10 | 0.13 | 0.15 | 0.13 | 0.12 | 0.10 |
| Wet-heat Resistance | 3/3 | 3/3 | 3/3 | 3/3 | 3/3 | 2/3 |
| Flame Resistance | V-0 | V-0 | V-0 | V-0 | V-0 | V-0 |

TABLE 2

Physical Property Data of Each Embodiment and Comparative Example (continued)

| performance index | Embodiment 7 | Embodiment 8 | Embodiment 9 | Embodiment 10 | Embodiment 11 |
|---|---|---|---|---|---|
| Tg(DMA)/° C. | 245 | 335 | 245 | 325 | 310 |
| Dk(5G) | 3.85 | 3.85 | 3.85 | 3.85 | 3.84 |
| Df(5G) | 0.0065 | 0.0075 | 0.0065 | 0.0065 | 0.0065 |
| water Absorption, % | 0.12 | 0.13 | 0.12 | 0.15 | 0.15 |
| Wet-heat Resistance | 3/3 | 3/3 | 3/3 | 3/3 | 3/3 |
| Flame Resistance | V-0 | V-0 | V-0 | V-0 | V-0 |

TABLE 3

Physical Property Data of Each Embodiment and Comparative Example (continued)

| performance index | Embodiment 12 | Embodiment 13 | Embodiment 14 |
|---|---|---|---|
| Tg(DMA)/° C. | 254 | 310 | 315 |
| Dk(5G) | 3.8 | 3.9 | 3.9 |
| Df(5G) | 0.0065 | 0.005 | 0.0045 |
| Water Absorption, % | 0.11 | 0.10 | 0.09 |
| Wet-heat Resistance | 3/3 | 3/3 | 3/3 |
| Flame resistance | V-0 | V-0 | V-0 |

TABLE 4

Physical Property Data of Each Embodiments and Comparative Examples (continued)

| performance index | Comparative Example 1 | Comparative Example 2 | Comparative Example 3 | Comparative Example 4 |
|---|---|---|---|---|
| Tg(DMA)/° C. | 150 | 180 | 160 | 320 |
| Dk(5G) | 3.95 | 3.95 | 3.95 | 3.8 |
| Df(5G) | 0.009 | 0.006 | 0.009 | 0.009 |
| Water Absorption, % | 0.25 | 0.25 | 0.25 | 0.3 |
| Wet-heat Resistance | 0/3 | 1/3 | 0/3 | 3/3 |
| Flame resistance | V-0 | V-1 | V-0 | V-1 |

The methods of performance testing above are as follows:

(1) glass transition temperature (Tg): measuring with DMA assay. Take measurement with the DMA assay specified in IPC-TM-650 2.4.24;

(2) dielectric constant and dielectric loss factor: take measurement with SPDR method;

(3) wet-heat resistance evaluation: evaluating the substrate lamina after the copper foil on the surface of copper-clad laminate was etched; treating the substrate lamina in a pressure cooker at 120° C., 105 KPa for 4 hours; then impregnating the substrate lamina in a tin furnace at 288° C.; recording the corresponding time once the substrate lamina is delaminated; ending the evaluation if no bubble or delamination occurred after the substrate lamina was in a tin furnace for 5 min;

(4) flame resistance: measuring with UL94 standard method.

Physical Properties Analysis

It is shown by the physical property data in table 1-4: in Comparative Examples 1-3, the prior phosphonate ester is used as flame retardant and equated to plasticizer in the system due to its low molecular weight and non-reactivity. Compared with Embodiments 1-14, the glass transition temperature is obviously reduced by phosphonate ester, thereby the wet-heat resistance is poor, water-absorption rate is high, and the requirements of heat resistance of present lead-free technology cannot be met. In Comparative Example 4, excellent heat resistance and low water-absorption can be achieved without addition of flame retardant, but flame resistance is poor, lower than V-0 level, thus it can not meet the requirement of the laminates.

In summary, compared with the common copper-clad laminate, the copper-clad laminate of the present invention achieves halogen-free flame resistance, and at the same time has excellent dielectric properties, higher glass transition temperature, and good wet-heat resistance, thus it is suitable for the application field of lead-free high speed communication.

The above are merely preferred embodiments of the present invention. Those skilled in the art can make numerous variations and changes according to the technical solution and spirit of the present invention, which all fall in the protection scope of the claims of the present invention.

The applicant stated that the present invention employ the embodiments above to describe the detailed components the present invention, but the present invention is not limited to the detailed components above, i.e. it does not mean that the present invention must rely on the detailed components above to be implemented. Persons skilled in the art should understand, any improvement of the present invention, the equivalent replacement to the raw materials of the present invention product, addition of auxiliary ingredients, selection of specific mode, etc. all fall within the protection scope and disclosure scope of the present invention.

The invention claimed is:

1. A thermosetting resin composition, wherein the resin composition comprises:
   (A) 50-90 weight parts of novolac type cyanate ester compound;

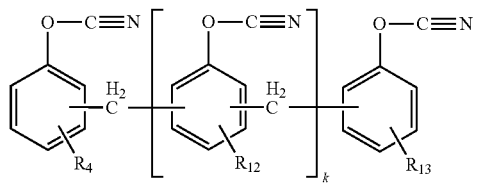

wherein,
   $R_4$, $R_{12}$, and $R_{13}$ are each independently selected from the group consisting of hydrogen atom, substituted or unsubstituted C1-C4 straight chain alkyl and substituted or unsubstituted C1-C4 branched alkyl; K is any integer from 1 to 7,
   (B) 10-50 weight parts of phosphonate-carbonate copolymer

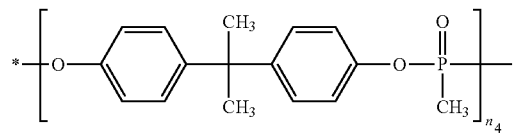

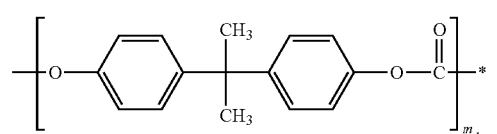

$m_1$ is any integer from 1 to 100;
   $n_4$ is any integer from 1 to 75; and
   (C) 15-30 weight parts of naphthol type novolac epoxy resin (I) or biphenyl type novolac epoxy resin (II);

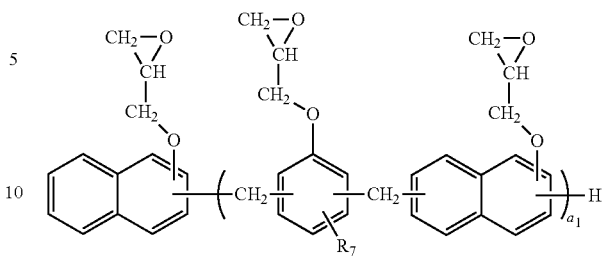

wherein $a_1$, is any integer from 1 to 10, and $R_7$ is selected from the group consisting of hydrogen atom, substituted or unsubstituted C1-C5 straight chain alkyl and substituted or unsubstituted C1-C5 branched alkyl;

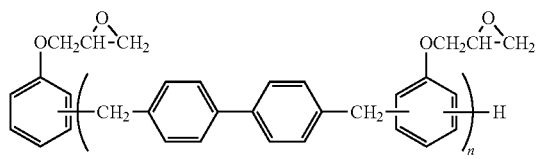

n is any integer from 1 to 10.

2. The thermosetting resin composition according to claim 1, wherein the thermosetting resin composition further comprises (D) filler;
   the filler is selected from organic fillers and/or inorganic fillers;
   the inorganic filler is one or more selected from the group consisting of nonmetal oxide, metal nitride, non-metal nitride, inorganic hydrate, inorganic salt, metal hydrate and inorganic phosphorus;
   the organic filler is any one or a mixture of at least two selected from the group of polytetrafluoroethylene powder, polyphenylene sulfide, organophosphorus compounds and polyether sulfone powder;
   the median particle diameter of the filler is 0.01-50μm;
   based on the total weight of the component(A), component(B) and component(C) of 100parts, the addition amount of the component (D) is 5~1000 parts by weight.

3. The thermosetting resin composition according to claim 1, wherein the thermosetting resin composition further comprises component (E) catalyst;
   the catalyst is one or more selected from the group consisting of organic metal compounds, imidazole compounds and derivatives thereof, and tertiary amine;
   the metal is one or more selected from the group consisting of zinc, copper, iron, tin, cobalt and aluminum;
   based on the total weight of the component (A), component (B) and component (C) of 100 parts, the addition amount of component (E) catalyst is 0.01-1.0 parts by weight.

4. The thermosetting resin composition according to claim 1, wherein the thermosetting resin composition further comprises:
   (D) filler of 5-1000 parts by weight based on the total weight of the component (A), component (B) and component (C) of 100 parts; and (E) catalyst of 0.01-1.0 parts by weight based on the total weight of the component (A), component (B) and component (C) of 100 parts.

5. A prepreg, wherein the prepreg comprises the enhancement material and the thermosetting resin composition according to claim 1 which adheres to the enhancement material by impregnation and drying.

6. A laminate, wherein the laminate comprises at least one prepreg according to claim 5.

7. A high-frequency circuit board, wherein the high-frequency circuit board comprises at least one prepreg according to claim 5 and the copper foils covered on both sides of stacked prepregs.

* * * * *